United States Patent

Asahi

[11] Patent Number: 5,563,731
[45] Date of Patent: Oct. 8, 1996

[54] MONITOR CONTROL SIGNAL RECEIVING APPARATUS FOR OPTICAL FIBER AMPLIFIER

[75] Inventor: Koji Asahi, Tokyo, Japan

[73] Assignee: NEC Corporation, Tokyo, Japan

[21] Appl. No.: 392,175

[22] Filed: Feb. 22, 1995

[51] Int. Cl.⁶ .............................. H01S 3/10; H04J 14/00; G02F 1/35
[52] U.S. Cl. ........................................ 359/341; 359/177
[58] Field of Search ................................ 359/160, 177, 359/337, 341; 385/1

[56] References Cited

U.S. PATENT DOCUMENTS

| | | | |
|---|---|---|---|
| 4,995,100 | 2/1991 | Stallard et al. | 359/341 |
| 5,054,876 | 10/1991 | Grasso et al. | 359/345 |
| 5,138,621 | 8/1992 | Goto et al. | 372/6 |
| 5,355,250 | 10/1994 | Grasso et al. | 359/341 |

FOREIGN PATENT DOCUMENTS

| | | |
|---|---|---|
| 119328 | 5/1990 | Japan. |
| 3-87727 | 4/1991 | Japan. |
| 6338874 | 12/1994 | Japan. |

*Primary Examiner*—Nelson Moskowitz
*Attorney, Agent, or Firm*—Whitham, Curtis, Whitham & McGinn

[57] ABSTRACT

A monitor control signal receiving apparatus for an optical fiber amplifier includes a laser diode, an optical coupler, a rare-earth-element-doped optical fiber, a pin photodiode, a controller, and a monitor signal extractor. The laser diode generates pump light. The optical coupler optically wavelength-multiplexes an input optical signal and the pump light from the laser diode. The rare-earth-element-doped optical fiber receives the optical signal and pump light from the optical coupler. The pin photodiode converts part of an optically amplified optical signal from the rare-earth-element-doped optical fiber into an electrical signal. The controller compares the electrical signal from the photoelectric converter with a reference voltage to control the laser diode such that an output level of the optical signal from the optical fiber is kept constant. The monitor signal extractor extracts a monitor control signal from an output from the controller.

6 Claims, 2 Drawing Sheets

MONITOR CONTROL SIGNAL RECEIVING APPARATUS FOR OPTICAL FIBER AMPLIFIER

BACKGROUND OF THE INVENTION

The present invention relates to a transmission system, for a repeater monitor signal, using an optical fiber amplifier as a repeater in which a rare earth element such as Er is doped and, more particularly, to a monitor control signal receiving apparatus, for an optical fiber amplifier, for receiving a monitor signal superposed by performing amplitude modulation for a main signal.

In a general optical amplifier, signal light is propagated together with pump light through a rare-earth-element-doped optical fiber obtained by doping a rare earth element such as Er in an optical fiber, thereby amplifying the signal light. FIG. 2 shows a conventional monitor control signal receiving apparatus for an optical fiber amplifier. Referring to FIG. 2, reference symbol c denotes an input signal; and d, an output signal. Reference numeral 21 denotes an optical signal input terminal to which a received optical signal is applied. A main signal amplitude-modulated by a monitor control signal is input to the optical signal input terminal 21. This received optical signal is input to an Er-doped optical fiber 23 through a wavelength division multiplexing coupler 22. On the other hand, similarly, pump light output from a pumping semiconductor laser diode 31 is input to the Er-doped optical fiber 23 through the wavelength division multiplexing coupler 22.

The received optical signal input from the optical signal input terminal 21 of the Er-doped optical fiber 23 is pumped by the pump light input from the pumping semiconductor laser diode 31 to be optically amplified. The optical signal amplified by the Er-doped optical fiber 23 is transmitted to an optical signal output terminal 24, and is partially monitored by a pin photodiode 25 and a current/voltage converter 26. A monitor control signal extractor 32 extracts a monitor control signal from the monitored waveform, and transmits a reproduced monitor control signal to a monitor control signal output terminal 33.

A monitor voltage output from the current/voltage converter 26 is compared with a reference voltage 27 by an operational amplifier 28, and a low-pass filter 29 sufficiently removes a monitor control signal component from the monitor voltage. Thereafter, the voltage is fed back to a pumping laser diode driver 30. The operational amplifier 28 controls the laser diode driver 30 such that the average level of an optical signal output is kept constant.

In this conventional monitor control signal receiving apparatus, since a monitor control signal is extracted from an output signal from the optical fiber amplifier, a monitor control signal which is not necessary for an optical signal receiver cannot be suppressed by an optical fiber amplifier controller. For this reason, the characteristics of the optical signal receiver may be adversely affected by the monitor control signal.

SUMMARY OF THE INVENTION

It is an object of the present invention to provide a monitor control signal receiving apparatus, for an optical fiber amplifier, in which a monitor control signal is suppressed to reduce an influence on an optical signal receiver.

In order to achieve the above object, according to the present invention, there is provided a monitor control signal receiving apparatus for an optical fiber amplifier, comprising pump light generating means for generating pump light, optical coupler means for optically wavelength-multiplexing an input optical signal and the pump light from the pump light generating means, a rare-earth-element-doped optical fiber for receiving the optical signal and pump light from the optical coupler means, photoelectric converting means for converting part of an optically amplified optical signal from the rare-earth-element-doped optical fiber into an electrical signal, control means for comparing the electrical signal from the photoelectric converting means with a reference voltage to control the pump light generating means such that an output level of the optical signal from the optical fiber is kept constant, and monitor signal extracting means for extracting a monitor control signal from an output from the control means.

DESCRIPTION OF THE PREFERRED EMBODIMENT

The present invention will be described below with reference to the accompanying drawing.

Figure 1:
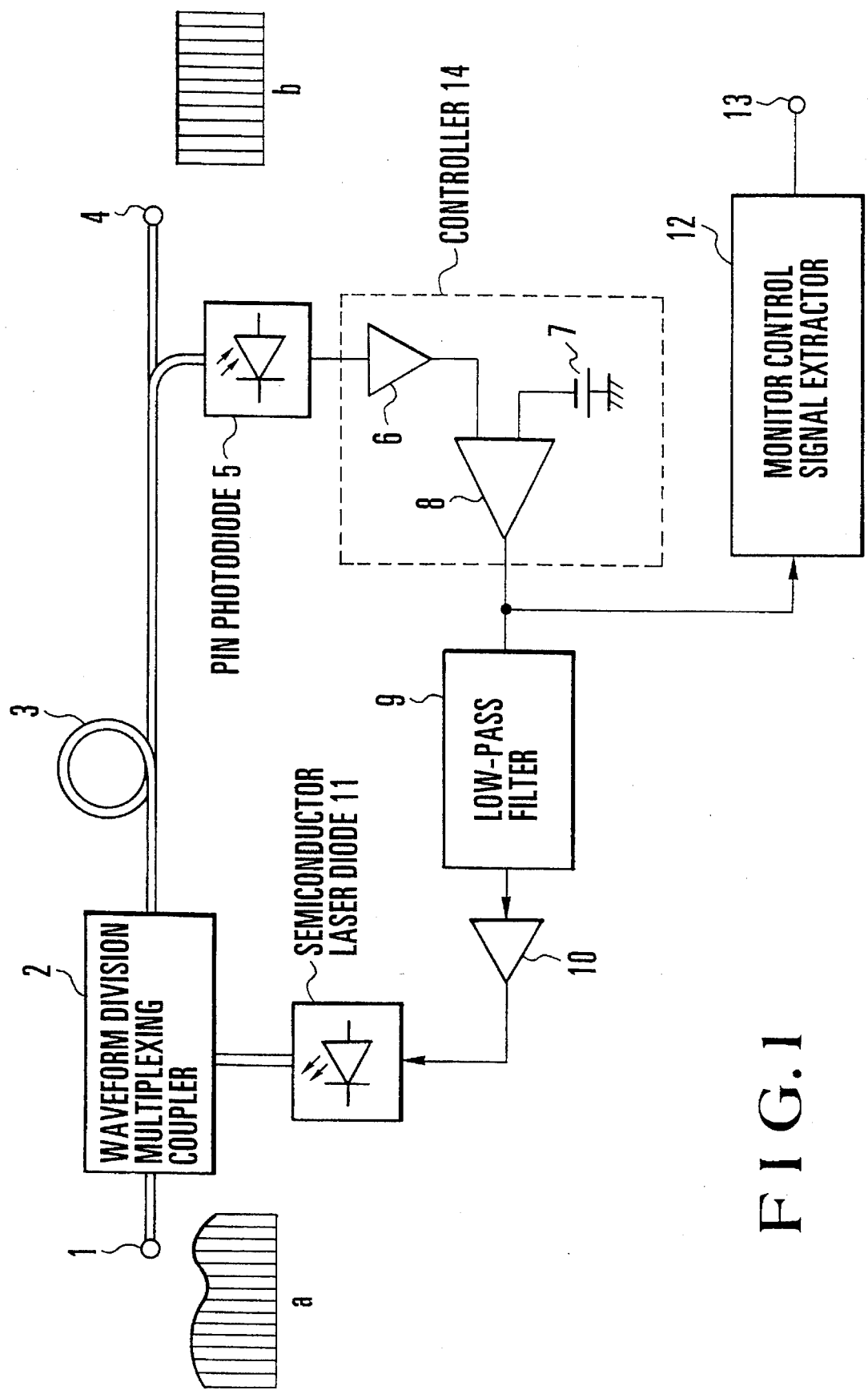
FIG. 1 is a block diagram showing a monitor control signal receiving apparatus for an optical fiber amplifier according to an embodiment of the present invention.
Figure 2:
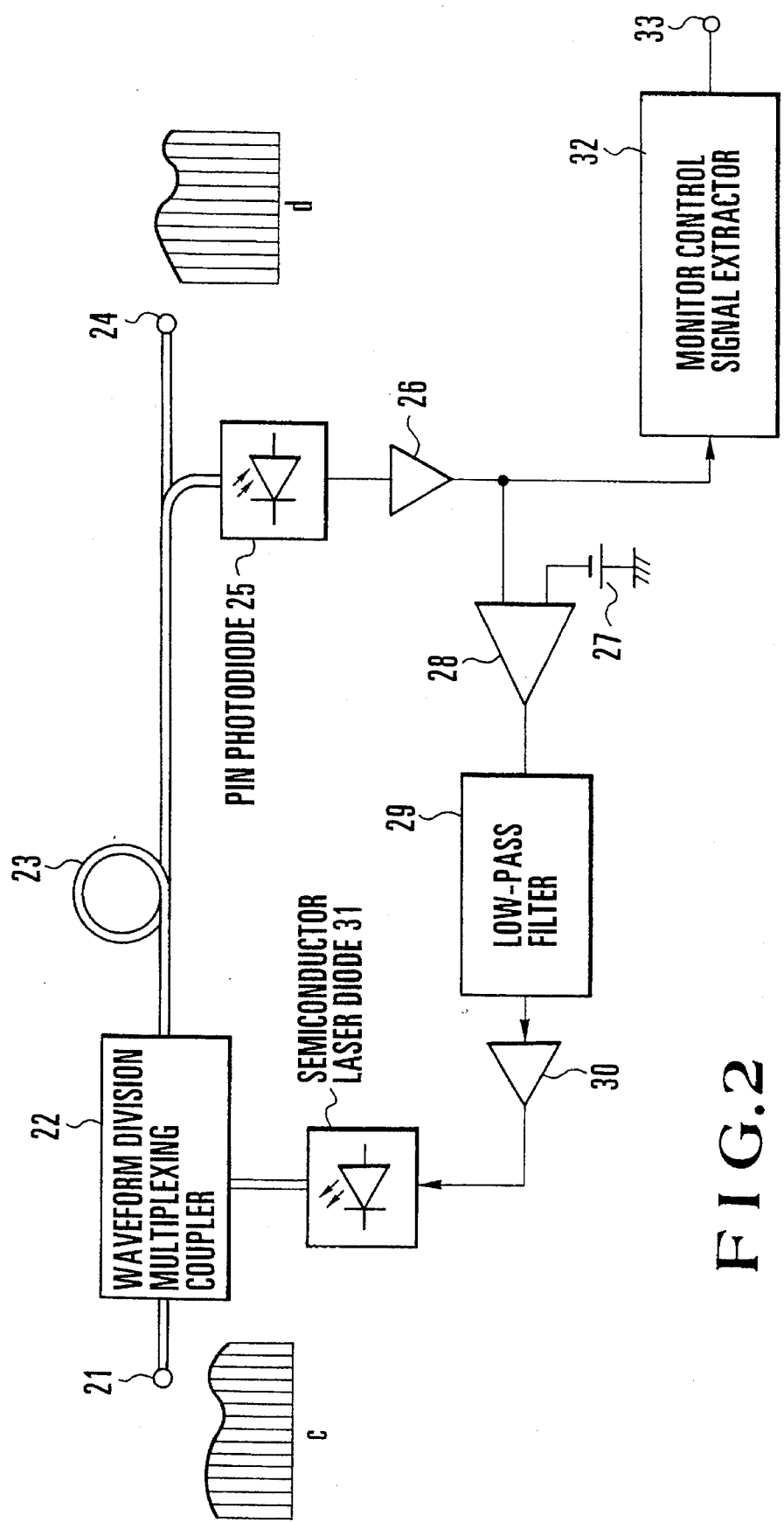
FIG. 2 is a block diagram showing a conventional monitor control signal receiving apparatus for an optical fiber amplifier.

FIG. 1 shows a monitor control signal receiving apparatus for an optical fiber amplifier according to an embodiment of the present invention. Referring to FIG. 1, reference symbol a denotes an input signal; and b, an output signal. Reference numeral 1 denotes an optical signal input terminal to which a received optical signal is applied; 2, a wavelength division multiplexing coupler for optically wavelength-multiplexing an optical signal from the optical signal input terminal 1 and pump light (to be described later); 3, an Er-doped optical fiber for receiving an optical signal and pump light from the wavelength division multiplexing coupler 2 to optically amplify the optical signal; and 4, an optical signal output terminal for outputting the optical signal from the Er-doped optical fiber 3 to repeat the optical signal.

Reference numeral 5 denotes a pin photodiode for converting part of the amplified optical signal output from the Er-doped optical fiber 3 into an electrical signal; 6, a current/voltage converter for converting a current signal from the pin photodiode 5 into a voltage signal; 8, an operational amplifier for comparing a voltage output from the current/voltage converter 6 with a reference voltage 7; 9, a low-pass filter for removing a noise component included in a signal output from the operational amplifier 8 to stabilize a feed back loop (to be described later); 10, a laser diode driver for driving a pumping semiconductor laser diode 11 by an output from the low-pass filter 9. Pump light from the pumping semiconductor laser diode 11 is output to the wavelength division multiplexing coupler 2. The current/voltage converter 6 and the operational amplifier 8 constitute a controller 14 for comparing the electrical signal from the pin photodiode 5 with the reference voltage 7 to negatively feed back the pumping semiconductor laser diode 11 through the low-pass filter 9 and the laser diode driver 10. Reference numeral 12 denotes a monitor signal extractor for extracting a monitor control signal from an output from the operational amplifier 8; and 13, a monitor control signal output terminal 13 for outputting the monitor control signal from the monitor signal extractor 12.

Note that the pin photodiode 5, the operational amplifier 8, the low-pass filter 9 and the laser diode driver 10 form an optical fiber amplifier feedback loop to the optical fiber amplifier formed by the optical fiber 3 and the pumping semiconductor laser diode 11.

The operation of the embodiment shown in FIG. 1 will be described below.

An optical signal input to the optical signal input terminal 1 is input to the Er-doped optical fiber 3 through the wavelength division multiplexing coupler 2. Similarly, pump light output from the pumping semiconductor laser diode 11 is input to the Er-doped optical fiber 3 through the wavelength division multiplexing coupler 2. The optical signal input to the Er-doped optical fiber 3 is pumped by the input pump light and optically amplified while propagating through the Er-doped optical fiber 3.

Part of the optical signal amplified by the Er-doped optical fiber 3 is extracted as a current signal by the pin photodiode 5, and is converted into a monitor voltage signal by the current/voltage converter 6. A voltage signal from the current/voltage converter 6 is compared with the reference voltage 7 by the operational amplifier 8, and a comparison output including the monitor control signal component is fed back to the pumping semiconductor laser diode 11 through the low-pass filter 9 and the laser diode driver 10. At this time, the controller 14 controls the pumping semiconductor laser diode 11 such that the level of an optical signal output from the optical signal output terminal 4 is kept constant independent of the level of the input optical signal, thereby suppressing the monitor control signal. More specifically, when the level of the output optical signal becomes higher than a reference level, the controller 14 controls the gain of the optical fiber amplifier formed by the Er-doped optical fiber 3 and the pumping semiconductor laser diode 11 to decrease the output level. When the level of the output optical signal becomes lower than the reference level, the controller 14 controls the gain of the optical fiber amplifier to increase the output level.

The output from the controller 14 is also output to the monitor signal extractor 12, and the monitor signal extractor 12 extracts the monitor control signal from the output from the operational amplifier 8 to output the monitor control signal to a monitor control signal output terminal 13. That is, the monitor control signal is extracted from an output obtained after the output voltage of the optical fiber amplifier is compared with the reference voltage 7.

As has been described above, according to the present invention, in order to control the output level of an optical output such that the output level is kept constant, a monitor control signal is extracted from a signal obtained after a branched output signal is compared with a reference voltage. For this reason, when the optical signal is to be optically amplified by an optical fiber amplifier, an influence on a receiver for a repeated optical signal can be advantageously suppressed by suppressing a monitor control signal.

What is claimed is:

1. A monitor control signal receiving apparatus for an optical fiber amplifier, comprising:

pump light generating means for generating pump light;

optical coupler means for optically wavelength-multiplexing an input optical signal and the pump light from said pump light generating means;

a rare-earth-element-doped optical fiber for receiving the optical signal and pump light from said optical coupler means;

photoelectric converting means for converting part of an optically amplified optical signal from said rare-earth-element-doped optical fiber into an electrical signal;

control means for comparing the electrical signal from said photoelectric converting means with a reference voltage to control said pump light generating means such that an output level of the optical signal from said optical fiber is kept constant; and monitor signal extracting means for extracting a monitor control signal from an output from said control means.

2. An apparatus according to claim 1, wherein said control means comprises current/voltage converting means for converting a current signal representing an electrical signal from said photoelectric converting means into a voltage signal and comparing means for comparing the voltage signal from said current/voltage converting means with said reference voltage, and said pump light generating means is controlled based on an output from said comparing means.

3. An apparatus according to claim 1, further comprising filter means for removing a noise component included in an output from said control means, and driving means for driving said pump light generating means based on an output from said filter means.

4. An apparatus according to claim 1, wherein said rare-earth-element-doped optical fiber comprises an Er-doped optical fiber.

5. An apparatus according to claim 1, wherein said pump light generating means comprises a laser diode.

6. An apparatus according to claim 1, wherein said photoelectric converting means comprises a pin photodiode.

* * * * *